(12) United States Patent
Ghis et al.

(10) Patent No.: US 9,975,755 B2
(45) Date of Patent: May 22, 2018

(54) MEMBRANE OF AMORPHOUS CARBON AND MEMS INCLUDING SUCH A MEMBRANE

(71) Applicant: COMMISSARIAT À L'ÉNERGIE ATOMIQUE ET AUX ÉNERGIES ALTERNATIVES, Paris (FR)

(72) Inventors: Anne Ghis, Saint Martin d'Heres (FR); Marc Delaunay, Meylan (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days. days.

(21) Appl. No.: 15/455,450

(22) Filed: Mar. 10, 2017

(65) Prior Publication Data

US 2017/0260041 A1    Sep. 14, 2017

(30) Foreign Application Priority Data

Mar. 10, 2016 (FR) ...................... 16 52000

(51) Int. Cl.
*B81B 3/00* (2006.01)
*B81C 1/00* (2006.01)

(52) U.S. Cl.
CPC .......... *B81B 3/0089* (2013.01); *B81B 3/0075* (2013.01); *B81C 1/00158* (2013.01); *B81B 2201/02* (2013.01); *B81B 2201/0264* (2013.01); *B81B 2201/03* (2013.01); *B81B 2201/06* (2013.01); *B81B 2203/0127* (2013.01); *B81B 2207/115* (2013.01)

(58) Field of Classification Search
CPC .... B81B 3/0089; B81B 3/0094; H01L 41/094
See application file for complete search history.

(56) References Cited

U.S. PATENT DOCUMENTS 6,953,977 B2 * 10/2005 Mlcak ................... B81B 3/0089
257/414

OTHER PUBLICATIONS

Search Report as issued in French Patent Application No. 1652000, dated Dec. 6, 2016.
Luo, J.K., et al., "Diamond and diamond-like carbon MEMS," Journal of Micromechanics & Microengineering, Institute of Physics Publishing, vol. 17, No. 7, Jul. 2007, XP020120165, pp. S147-S163.
Orlianges, J.C., et al., "Application of aluminum oxide and ta-C thin films deposited at room temperature by PLD in RF-MEMS fabrication," Thin Solid Films, vol. 482, No. 1-2, Jun. 2005, XP027865456, pp. 237-241.
George, S.M., "Atomic Layer Deposition: An Overview," Chem. Rev., vol. 110, (2010), pp. 111-131.
Ghis, A., et al., "Implementation and mechanical characterization of 2nm thin diamond like carbon suspended membranes," Diamond & Related Materials, vol. 57, (2015), pp. 53-57.

(Continued)

*Primary Examiner* — Mark Prenty
(74) *Attorney, Agent, or Firm* — Pillsbury Winthrop Shaw Pittman LLP

(57) ABSTRACT

A microelectromechanical system includes a membrane of amorphous carbon having a thickness between 1 nm and 50 nm, and for example between 3 nm and 20 nm.

4 Claims, 1 Drawing Sheet

(56) References Cited

OTHER PUBLICATIONS

Bulusu, A., et al., "Engineering the mechanical properties of ultrabarrier films grown by atomic layer deposition for the encapsulation of printed electronics," Journal of Applied Physics, vol. 118, (2015), pp. 085501-1-085501-8.
Tilmans, H.A.C., et al., "MEMS packaging and reliability: An undividable couple," Microelectronics Reliability, vol. 52 (2012), pp. 2228-2234.
Qin, Y., et al., "Polymer integration for packaging of implantable sensors," Sensors and Actuators B, vol. 202, (2014), pp. 758-778.
Cros, S., "Propriétés barrières des polymères utilisés en emballage," Techniques de l'Ingénieur, Jul. 2007, 19 pages.

* cited by examiner

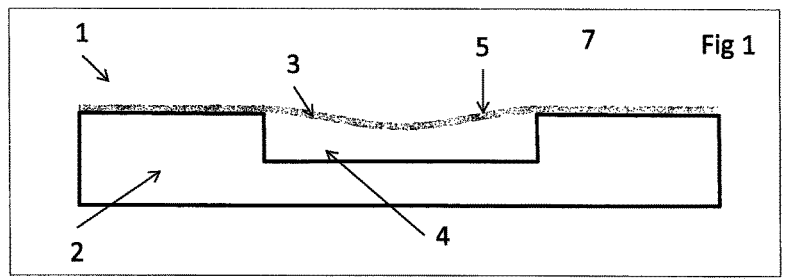
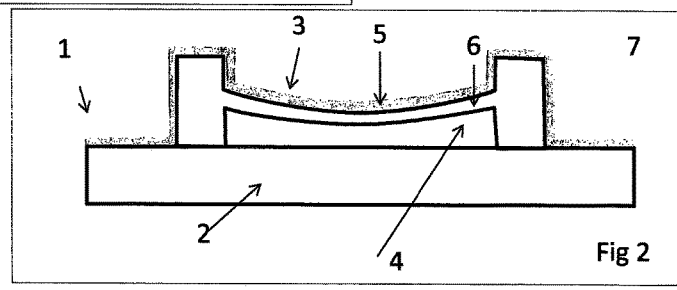
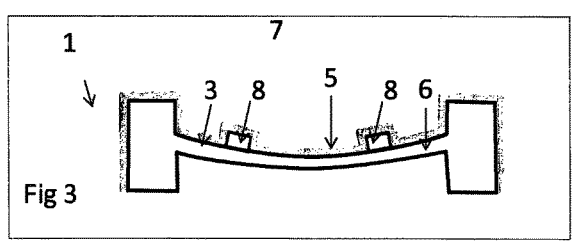
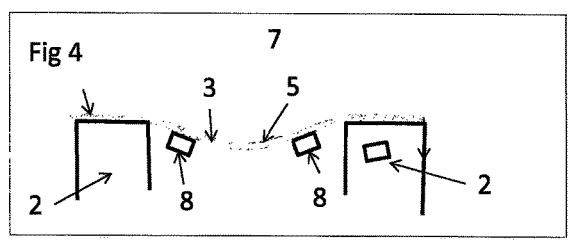

MEMBRANE OF AMORPHOUS CARBON AND MEMS INCLUDING SUCH A MEMBRANE

CROSS REFERENCES TO RELATED APPLICATIONS

This application claims priority to French Patent Application No. 1652000, filed Mar. 10, 2016, the entire content of which is incorporated herein by reference in its entirety.

FIELD

The invention relates to a membrane of amorphous carbon and to a microelectromechanical system (also referred to as MEMS) including a membrane of amorphous carbon.

BACKGROUND

Devices of the membrane MEMS type especially include pressure transducers which are intended to be immersed into a liquid or gas immersion medium. The immersion medium dictates its pressure to the surface of a suspended membrane. The latter deforms under the action of this pressure. The measured value of this deformation is representative of the value of the pressure applied. The deformation measurement can be made:
  either by capacitive effect. In this case, the deformable membrane is one of the armatures of an electrical capacitor. The deformation modifies the capacitance value, and the capacitance variation is electrically measured.
  or by piezoelectric effect. In this case, piezoelectric elements are mechanically associated with the membrane, so that the deformation thereof is representative of the deformation of the membrane. Deformation of the piezoelectric elements results in an electric potential difference occurring between two points of the piezoelectric element. This potential difference is measurable, which enables the deformation of the membrane and the pressure applied to be known.

Surfaces of MEMSs which are in contact with the external medium have sometimes to be unidirectional or bidirectional hermetic barriers, whether to protect the external medium from contaminations related to materials making up the MEMS or to protect the MEMS from aggressions of the external medium. Thus, a protective barrier enabling the external medium to be protected from contaminations related to the MEMS is for example necessary when the MEMS is introduced into a biological medium. A protective barrier can also be necessary when the MEMS is introduced into a harsh or corrosive medium. A hermetic protective barrier can also be necessary to keep a controlled atmosphere inside the MEMS, for example in case of gas diffusion.

To do so, it is known to use protective coatings on the membranes of the MEMSs. Prior art coatings can be metals, oxides, nitrogen or carbon compounds or even polymers. Choice criteria are chemical inertness, biocompatibility, hermeticity, electromagnetic transparency for communicating devices, and deposition techniques.

However, the coating should not modify rigidity of the movable membrane of the MEMS. But it is difficult to find a coating which does not modify the rigidity of the membrane of the MEMS, and which has in the meantime the necessary characteristics in terms of chemical inertness, biocompatibility and hermeticity.

SUMMARY

Aspects of the invention are directed to overcoming drawbacks of prior art by providing a membrane for a MEMS which is flexible enough in order not to significantly effect the operation of the MEMS, while being biocompatible, hermetic chemically inert and electromagnetically transparent.

To do so, a first aspect of the invention relates to a membrane of amorphous carbon for a microelectromechanical system, the membrane having a thickness between 1 nm and 50 nm, and for example between 3 nm and 20 nm in an embodiment.

Such a membrane has the benefit to be chemically inert, biocompatible and hermetic even with nanosize thicknesses, and stable up to temperatures higher than 300° C. Furthermore, such a membrane of amorphous carbon of such a thickness has the benefit to have a rigidity sufficiently low not to affect the operation of the microelectromechanical system, while keeping its chemical inertness and hermeticity properties.

Beneficially, the membrane of amorphous carbon has an $sp^3$ type hybridization rate between 20% and 40% which enables it to have a Young's modulus between 100 GPa and 500 GPa.

A second aspect of the invention relates to a microelectromechanical system including a membrane of amorphous carbon according to the first aspect of the invention.

The microelectromechanical system can include a movable membrane including such membrane of amorphous carbon.

According to different embodiments:
  the movable membrane can include as the only membrane the membrane of amorphous carbon. In this case, the membrane of amorphous carbon makes up the movable membrane of the microelectromechanical system, without need for lining it with another membrane. This embodiment enables a microelectromechanical system to be made with a very flexible movable membrane;
  the movable membrane can include a main membrane, the main membrane being coated with the membrane of amorphous carbon. In this case, the membrane of amorphous carbon forms a protective coating deposited on the main membrane of the microelectromechanical system.

According to different embodiments:
  the microelectromechanical system can be an actuator or a sensor;
  the microelectromechanical system can be a capacitive transducer;
  the microelectromechanical system can be a piezoelectric transducer.

BRIEF DESCRIPTION OF THE FIGURES

Further characteristics and benefits of the invention will appear upon reading the following detailed description, with reference to the accompanying figures, which show:

FIG. 1, a schematic representation of a microelectromechanical system according to an embodiment of the invention;

FIG. 2, a schematic representation of a microelectromechanical system according to another embodiment of the invention;

FIG. 3, a schematic representation of a microelectromechanical system according to another embodiment of the invention; and FIG. 4, a schematic representation of a microelectromechanical system according to another embodiment of the invention.

DETAILED DESCRIPTION

FIG. 1 represents a microelectromechanical system 1 according to an embodiment of the invention. The microelectromechanical system 1 is a capacitive transducer. It includes a stationary armature 2 and a movable membrane 3, separated by a cavity 4. Displacement of the movable membrane 2 can be caused either by a pressure of the external medium 7 if the transducer operates in a sensor mode, or by an electric voltage if the transducer operates in an actuator mode.

The movable membrane 3 includes a membrane 5 of amorphous carbon. This membrane 5 of amorphous carbon has a thickness between 2 nm and 50 nm.

FIG. 2 represents a microelectromechanical system according to another embodiment of the invention. This microelectromechanical system 1 is a capacitive transducer. It includes a stationary armature 2 and a movable membrane 3, separated by a cavity 4. The displacement of the movable membrane 3 can be caused either by a pressure of the external medium 7 if the transducer operates in a sensor mode, or by an electric voltage if the transducer operates in an actuator mode.

The movable membrane 3 includes a main membrane 6 coated with a membrane 5 of amorphous carbon. The membrane 5 of amorphous carbon has a thickness between 1 nm and 50 nm, and for example between 3 nm and 20 nm in an embodiment, so as not to modify the rigidity of the main membrane 6. The membrane 5 of amorphous carbon can be deposited either by direct deposition onto the main membrane, or by layer transfer.

FIG. 3 represents another embodiment in which the microelectromechanical system 1 is a piezoelectric transducer. In this embodiment, the microelectromechanical system includes a movable membrane 3 on which at least one piezoelectric sensor 8 or piezoelectric actuator 8 is attached. The movable membrane 3 includes, as in the previous embodiment, a main membrane 6 coated with a membrane 5 of amorphous carbon. The membrane 5 of amorphous carbon has a thickness between 1 nm and 50 nm, and for example between 3 nm and 20 nm in an embodiment, so as not to modify rigidity of the main membrane 6. The membrane of amorphous carbon can be deposited either by direct deposition onto the main membrane, or by layer transfer.

With reference to FIG. 4, it could also be considered that the movable membrane includes only the membrane of amorphous carbon as in the embodiment of FIG. 1. In this case, the piezoelectric sensors or actuators are attached beneath the membrane. In other words, in this case, the membrane includes a first face intended to be in contact with the external medium 7 and a second face on which the piezoelectric sensor(s) or actuator(s) 8 are attached. The benefit of this configuration is that the rigidity of the membrane is minimum, and therefore, transduction between mechanical movement of the membrane and electric signal across the piezoelectric sensors or actuators, for control or reading, is made in a minimum energy. The membrane of amorphous carbon has a thickness between 2 nm and 50 nm, determined as a function of the positioning of the piezoelectric sensors or actuators 8.

The membrane of amorphous carbon used in the microelectromechanical systems of FIGS. 1 to 4 has an $sp^3$ type hybridization rate between 20% and 40% which enables it to have a Young's modulus between 100 GPa and 500 GPa. Indeed, the carbon atoms hybridize their outer orbitals s and p into $sp^2$ and $sp^3$ to form π or σ type bonds, the relative rates of these bonds is decisive for the properties of the material: basically, u bonds govern the electronic behavior of the membrane, and a bonds determine the mechanical behavior thereof. The rate of appearance of each of both bonds in the material can be experimentally determined by X-ray photoelectron spectrometry or by Raman spectroscopy. The sample is degassed during the measurement.

The membrane of amorphous carbon 5 is flexible. Indeed, the membrane of amorphous carbon has a Young's modulus between 100 GPa and 500 GPa.

The membrane 5 of amorphous carbon is chemically inert, biocompatible, hermetic even with nanosize thicknesses, and stable up to temperatures higher than 300° C. The membrane 5 of amorphous carbon enables both the main membrane 6 to be protected from aggressions of the external medium 7 and also the external medium to be protected from contaminations generated by the main membrane 6, the support 2, and all the elements of the MEMS, which is particularly interesting when the external medium is a biological medium.

Such a membrane of amorphous carbon can be for example manufactured in the device described in application FR no. 1560224. Indeed, this device allows manufacture of low thickness continuous homogenous elastic layers of amorphous carbon, the $sp^3$ bond rate of which is higher than 20%, and on any type of substrate.

It will be appreciated that the invention is not limited to be embodiments described with reference to the figures and alternatives could be considered without departing from the scope of the invention. The membrane of amorphous carbon could be for example used in other microelectromechanical systems than those described with reference to the figures.

The invention claimed is:

1. A microelectromechanical system including a membrane of amorphous carbon, wherein the membrane of amorphous carbon has a thickness between 1 nm and 50 nm, wherein the membrane of amorphous carbon has an $sp^3$ type hybridization rate between 20% and 40%, and wherein the microelectromechanical system is a piezoelectric transducer.

2. The microelectromechanical system according to claim 1, wherein the thickness is between 3 nm and 20 nm.

3. The microelectromechanical system according to claim 1, further comprising a movable membrane including the membrane of amorphous carbon.

4. The microelectromechanical system according to the claim 3, wherein the movable membrane includes a main membrane, the main membrane being coated with the membrane of amorphous carbon.

* * * * *